United States Patent
Kim et al.

(10) Patent No.: US 12,211,914 B2
(45) Date of Patent: Jan. 28, 2025

(54) BURIED GATE AND MANUFACTURING METHOD THEREOF

(71) Applicant: CHANGXIN MEMORY TECHNOLOGIES, INC., Hefei (CN)

(72) Inventors: Cheong Soo Kim, Hefei (CN); Yong Gun Kim, Hefei (CN); Xianrui Hu, Hefei (CN); GuangSu Shao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 32 days.

(21) Appl. No.: 17/595,936

(22) PCT Filed: May 25, 2021

(86) PCT No.: PCT/CN2021/095654
§ 371 (c)(1),
(2) Date: Nov. 29, 2021

(87) PCT Pub. No.: WO2022/016985
PCT Pub. Date: Jan. 27, 2022

(65) Prior Publication Data
US 2023/0140073 A1    May 4, 2023

(30) Foreign Application Priority Data
Jul. 22, 2020  (CN) .................. 202010708729.X

(51) Int. Cl.
*H01L 21/768*  (2006.01)
*H01L 21/48*  (2006.01)
(Continued)

(52) U.S. Cl.
CPC ........ *H01L 29/4236* (2013.01); *H01L 29/401* (2013.01); *H10B 12/053* (2023.02); *H10B 12/34* (2023.02); *H10B 12/488* (2023.02)

(58) Field of Classification Search
CPC .............. H01L 29/4236; H01L 29/401; H01L 29/42352; H01L 29/66621;
(Continued)

(56) References Cited

U.S. PATENT DOCUMENTS 5,658,381 A   8/1997  Thakur et al.
5,763,306 A   6/1998  Tsai
(Continued)

FOREIGN PATENT DOCUMENTS

CN    1195886 A     10/1998
CN    102173376 A    9/2011
(Continued)

OTHER PUBLICATIONS

International Search Report (ISR) in international application No. PCT/CN2021/095654 mailed on Aug. 30, 2021.

*Primary Examiner* — Antonio B Crite
*Assistant Examiner* — Tenley H Schofield
(74) *Attorney, Agent, or Firm* — SYNCODA LLC; Feng Ma

(57) ABSTRACT

A method for manufacturing a buried gate includes: providing a substrate; forming a word line trench in the substrate; treating a surface of the word line trench to form concave structures on the surface of the word line trench; and, forming a conductive layer in the word line trench, convex structures matched with the concave structures being provided on a surface of the conductive layer.

5 Claims, 4 Drawing Sheets

(51) Int. Cl.

| | |
|---|---|
| *H01L 21/56* | (2006.01) |
| *H01L 21/66* | (2006.01) |
| *H01L 21/68* | (2006.01) |
| *H01L 23/00* | (2006.01) |
| *H01L 23/31* | (2006.01) |
| *H01L 23/495* | (2006.01) |
| *H01L 23/498* | (2006.01) |
| *H01L 23/522* | (2006.01) |
| *H01L 23/528* | (2006.01) |
| *H01L 23/532* | (2006.01) |
| *H01L 25/065* | (2023.01) |
| *H01L 27/088* | (2006.01) |
| *H01L 29/40* | (2006.01) |
| *H01L 29/423* | (2006.01) |
| *H10B 12/00* | (2023.01) |
| *H10B 41/27* | (2023.01) |
| *H10B 43/27* | (2023.01) |

(58) Field of Classification Search
CPC ....... H01L 29/66628; H01L 21/823462; H01L 21/31116; H01L 29/78; H01L 29/42368; H01L 27/108; H01L 27/10832; H01L 27/10835; H01L 27/10838; H01L 27/10861–1087; H01L 27/10829–10841; H10B 12/053; H10B 12/34; H10B 12/488; H10B 12/395; H10B 12/0383
See application file for complete search history.

(56) References Cited

U.S. PATENT DOCUMENTS

| | | |
|---|---|---|
| 6,194,263 B1 | 2/2001 | Kim et al. |
| 6,770,526 B2 | 8/2004 | Chudzik et al. |
| 8,525,262 B2 | 9/2013 | Wu et al. |
| 2002/0072171 A1* | 6/2002 | Forster ............. H10B 12/038 257/E21.651 |
| 2009/0267126 A1 | 10/2009 | Wang et al. |
| 2015/0194438 A1* | 7/2015 | Kim ................. H10B 12/488 257/324 |
| 2015/0294934 A1* | 10/2015 | Kadoya ............ H10B 12/09 257/757 |
| 2016/0351711 A1* | 12/2016 | Bae ................. H01L 27/11807 |

FOREIGN PATENT DOCUMENTS

| | | | |
|---|---|---|---|
| CN | 103059610 A | 4/2013 | |
| CN | 109037369 A | 12/2018 | |
| KR | 20100101417 | * 9/2010 | ......... H01L 29/4236 |

* cited by examiner

BURIED GATE AND MANUFACTURING METHOD THEREOF

CROSS-REFERENCE TO RELATED APPLICATIONS

This application is a national stage of International Application No. PCT/CN2021/095654 filed on May 25, 2021 which claims priority to Chinese Patent Application No. 202010708729.X filed on Jul. 22, 2020. The disclosures of the above-referenced applications are hereby incorporated by reference in their entirety.

TECHNICAL FIELD

The present application relates to the technical field of semiconductor storage devices, in particular to a buried gate and a manufacturing method thereof.

BACKGROUND

In order to improve the integration of dynamic random access memories (DRAMs) to increase the operation speed of devices and satisfy the consumers' demand for miniature electronic devices, buried word line DRAMs have been developed in recent years to increase the integration of transistors of storage units and improve the characteristics of device so as to satisfy the above demand.

Due to the small size of the DRAM device itself, the area of active regions will often be affected due to process limitations, so that the length of gate channels (a part formed between sources and drains on both sides of the word line trench) becomes smaller, thereby producing an obvious short channel effect and affecting the performance of the device.

SUMMARY

The present application provides a buried gate and a manufacturing method thereof in order to improve the short channel effect caused by the reduction in device size.

A method for manufacturing a buried gate is provided, comprising:
  providing a substrate;
  forming a word line trench in the substrate;
  treating a surface of the word line trench to form concave structures on the surface of the word line trench; and
  forming a conductive layer in the word line trench, convex structures matched with the concave structures being provided on a surface of the conductive layer.

In one embodiment, the forming concave structures on the surface of the word line trench comprises:
  forming a plurality of hemispherical silicon crystal particles on the surface of the word line trench;
  etching the surface of the word line trench by using the plurality of hemispherical silicon crystal particles as masks to form the concave structures; and
  removing the plurality of hemispherical silicon crystal particles.

In one embodiment, the hemispherical silicon crystal particles are formed by an LPCVD process, in the LPCVD process, a reaction gas comprises SiH4, a reaction temperature ranges from 500° C. to 600° C., and a reaction pressure ranges from 0.1 torr to 0.5 torr.

In one embodiment, the forming a conductive layer in the word line trench comprises:
  forming a metal material layer, the metal material layer covering an upper surface of the substrate and filling the word line trench and the concave structures; and
  removing the metal material layer covering the upper surface of the substrate and a part of the metal material layer located in the word line trench, and using the reserved metal material layer as the conductive layer.

In one embodiment, before the forming a metal material layer, the method further comprises:
  forming a gate insulating layer, the gate insulating layer covering the surface of the word line trench and surfaces of the concave structures; and
  forming a metal block layer on a surface of the gate insulating layer, the metal block layer being located between the gate insulating layer and the conductive layer.

In one embodiment, the manufacturing method further comprises:
  forming an insulating filling layer, the insulating filling layer covering a surface of the substrate and filling the word line trench.

Based on the same inventive concept, a buried gate is further provided, comprising:
  a substrate;
  a word line trench, located in the substrate, recess structures being provided on a surface of the word line trench; and
  a conductive layer, located in the word line trench, bump structures matched with the recess structures being provided on a surface of the conductive layer.

In one embodiment, the buried gate further comprises a gate insulating layer, located between the conductive layer and the substrate.

In one embodiment, the conductive layer comprises a metal layer.

In one embodiment, the buried gate further comprises a metal block layer, located between the gate insulating layer and the metal layer.

To sum up, in the present application, by forming concave structures on the surface of the word line trench and then forming, in the word line trench, a conductive layer having convex structures matched with the concave structures on its surface, the length of the word line trench is increased by changing the shape of the word line structure without changing the width of the word line trench, so that the short channel effect caused by the reduction in device size is solved, and the performance of devices is improved.

Figure 1:
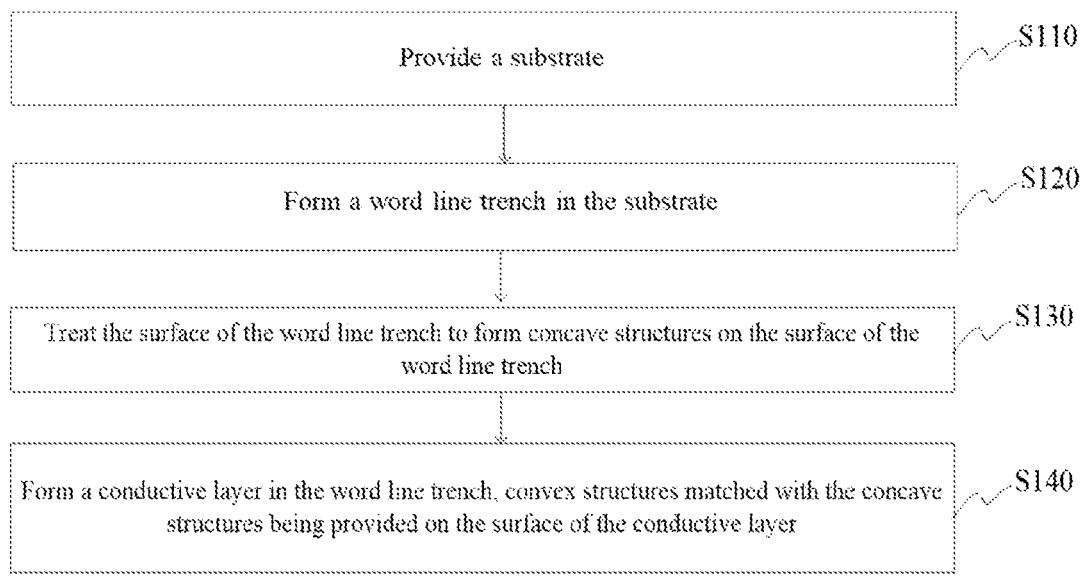
FIG. 1 is a flowchart of a method for manufacturing a semiconductor device according to an embodiment.

in which,
  100: substrate; 200: word line trench; 210: concave structure; 300: conductive layer; 310: convex structure; 400: gate insulating layer; 500: metal block layer; 600: insulating filling layer; and, 700: hemispherical silicon crystal particle.

DETAILED DESCRIPTION

In order to make the objectives, features and advantages of the present application more apparent and comprehensible, the specific implementations of the present application will be described below in detail with reference to the accompanying drawings. Numerous specific details will be stated in the following description in order to fully understand the present application. However, the present application can be implemented in various other ways different from those described herein, and those skilled in the art can make similar improvements without departing from the essence of the present application, so the present application is not limited by the specific implementations disclosed below.

Unless otherwise defined, all technical and scientific terms used herein have the same meanings as those commonly understood by those skilled in the art to which the present application belongs. The terms used in the specification of the present application are merely for describing specific embodiments, rather than limiting the present application.

It should be understood that, although various elements, components, regions, layers, doping types and/or parts are described by using terms such as first, second and third, these elements, components, regions, layers, doping types and/or parts shall not be limited by these terms. These terms are merely for distinguishing one element, component, region, layer, doping type or part from another element, component, region, layer, doping type or part. Therefore, without departing from the teaching of the present application, the first element, component, region, layer, doping type or part discussed below can be denoted as a second element, component, region, layer or part.

Here, the terms indicating the spatial relationship, such as "under", "underneath", "lower", "below", "above" and "upper", can be used for describing a relationship between one element or feature shown in the drawing and other elements or features. It should be understood that, in addition to the orientation shown in the drawing, the terms indicating the spatial relationship further include different orientations of the device in use and operation. For example, if the device in the drawing is turned upside down, the element or feature described as being "underneath" or "below" other element will be oriented to be "above" the other element or feature. Therefore, the exemplary terms "underneath" and "below" may include up and down orientations. In addition, the device may also include additional orientations (e.g., rotated at 90 degrees or other orientations), and the spatial description used herein are interpreted correspondingly.

It should be understood that, due to the small size of DRAM devices and the limitation of process conditions, the area of active regions is reduced, so that the length of gate channels becomes smaller. When the length of gate channels is reduced to a certain size, a short channel effect will be caused. For example, the threshold voltage is decreased, the operating current is reduced, the hot carrier effect is enhanced, the device cannot be turned off due to the degradation of threshold characteristics, or the like.

On this basis, an embodiment of the present application provides a method for manufacturing a buried gate. Referring to FIG. 1, the method for manufacturing a buried gate comprises following steps:

S110: providing a substrate 100;
S120: forming a word line trench 200 in the substrate 100;
S130: treating the surface of the word line trench 200 to form concave structures 210 on the surface of the word line trench 200; and
S140: forming a conductive layer 300 in the word line trench 200, convex structures 310 matched with the concave structures 210 being provided on the surface of the conductive layer 300.

It should be understood that, due to the small size of devices and the limitation of process conditions, the area of active regions is reduced, so that the length of gate channels becomes smaller. When the length of gate channels is reduced to a certain size, a short channel effect will be caused. For example, the threshold voltage is decreased, the operating current is reduced, the hot carrier effect is enhanced, the device cannot be turned off due to the degradation of threshold characteristics, or the like.

On this basis, in an embodiment of the present application, a word line trench 200 having a width equal to that of a standard word line trench 200 is firstly formed in the substrate 100; then, the surface of the word line trench 200 is etched to form concave structures 210 on the surface of the word line trench 200; and finally, a conductive layer 300 is formed in the word line trench 200, convex structures 310 matched with the concave structures 210 being provided on the surface of the conductive layer 300. The relative area between the conductive layer 300 and the word line trench 200 is increased by the concave structures 210 and the convex structures 310. Thus, under the premise of remaining the width of the gate channel unchanged, the length of the gate channel is increased, thereby improving the short channel effect caused by the reduction in device size.

For the convenience of describing the present application, the method for manufacturing a semiconductor device according to the present application will be described below in detail according to the sequential order of process steps.

S110 is executed to provide a substrate 100. Generally, the substrate 100 may comprise a semiconductor substrate, for example, a silicon substrate, an epitaxial silicon substrate, a silicon germanium substrate or a silicon-coated insulting substrate, but it is not limited thereto. Any substrate material known to those skilled in the art for bearing components of a semiconductor integrated circuit is possible.

In this embodiment, a shallow trench isolation structure (not shown) and active regions (not shown) are formed on the substrate 100, wherein the shallow trench isolation structure isolates the active regions from the surrounding environment. When the semiconductor device to be manufactured is a memory, the shallow trench isolation structure can isolate the active regions into an array arrangement to manufacture a memory array of the memory. The shallow trench isolation structure may comprise a shallow trench located in the substrate 100 and an isolation material filling the shallow trench. The isolation material may comprise a line oxide layer that is formed by a thermal oxidation process and covers the shallow trench, and silicon oxide that is located on the surface of the line oxide layer and fills the shallow trench, thereby improving the isolation performance of the shallow trench isolation structure.

In addition, in other embodiments, the substrate 100 comprises a silicon-on-insulator (SOI) substrate. The SOI substrate comprises a silicon material layer (not shown), a back substrate (not shown), and an oxidizing material layer (not) sandwiched between the silicon material layer and the back substrate.

It should be understood that, the SOI substrate is used in this embodiment, and the oxidizing material layer can be used as an etching stop layer in the process of etching of the word line trench 200, so that it is convenient to control the depth of the word line trench 200. Moreover, the oxidizing material layer can eliminate the influence of leakage current in the substrate substrate, so as to further improve the efficiency of the semiconductor device. In addition, the silicon material layer may be a non-doped silicon material layer or a doped silicon material layer. The doped silicon material layer may be an N-type or P-type doped silicon material layer.

Figure 2:
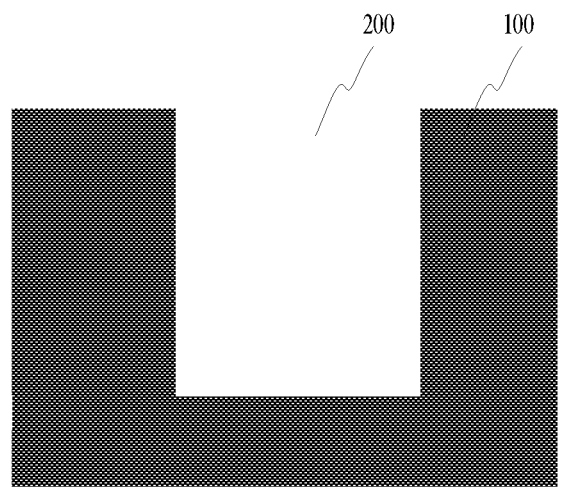
FIGS. 2-7 are schematic structure diagrams of a semiconductor structure after etched step by step according to an embodiment.

After the substrate 100 is formed, S120 is executed to form a word line trench 200 on the substrate 100. Referring to FIG. 2, in this embodiment, the steps of forming the word line trench 200 mainly comprises the following steps.

The active regions are doped to form sources (not shown) and/or drains (not shown) on both sides of the word line trench 200. Specifically, when two word line trenches 200 are formed in a single active region, there is a common source between the two word line trenches 200, and outer sides of the two word line trenches 200 correspond to drains, respectively. It should be understood that the time when the sources and drains are formed in the process flow can be adjusted according to actual process conditions, and this is not limited in this embodiment. For example, the sources and drains may be formed after the word line trench 200 is formed or after the conductive layer 300 is formed.

A hard mask layer is formed. Specifically, a mark material is deposited on the surface having the shallow trench isolation structure and the line oxide layer by a deposition process to form a hard mask layer. The deposition process comprises chemical vapor deposition (CVD), physical vapor deposition (PVD), atomic layer deposition (ALD) or the like. In this embodiment, an organic mask material and a hard mask material are successively deposited on the surface of the substrate to form an organic mask material layer and a hard mask material layer, respectively. The stacked organic mask material layer and hard mask material layer form the hard mask layer. Generally, the organic mask material layer is formed from a carbon-containing organic material, and the hard mask material layer is formed from one or more of silicon nitride, silicon oxynitride, silicon carbonitride, metal nitride, metal oxide and metal carbide. Silicon nitride (SiN) is preferable, because the silicon nitride material has the advantages of easy acquisition, low cost, mature manufacturing method or the like and has a higher etching selectivity than silicon oxide in the line oxide layer.

The hard mask layer is patterned to form an opening pattern running through the hard mask layer. The opening pattern defines the word line trench 200. Specifically, a matched reticle can be used to coat a photoresist layer on the hard mask material layer, and the photoresist layer is irradiated by a laser device through a photomask to cause chemical reaction of the photoresist in the exposed region. Then, the photoresist in the exposed region or unexposed region (the former is referred to as a negative photoresist, while the latter is referred to as a negative photoresist) is dissolved and removed by a developing technology, so that the pattern in the photomask is transferred to the photoresist layer to form a pattern for defining the word line trench 200. Then, the hard mask layer is etched to the surface of the line oxide layer by using the photoresist layer with the pattern as a reticle, to form a patterned hard mask layer with an opening pattern.

The photoresist is removed, and the patterned hard mask layer is used as a mask for continuous downward etching to form a word line trench 200 in the active region of the substrate. In some embodiments, a plurality of active regions are distributed in parallel and in a staggered manner, and each of the active regions is strip-shaped. The number of trenches formed in a single active region is not limited. Generally, two word line trenches 200 are formed in a single active region. In this embodiment, word line trenches 200 for burying the conductive layer 300 are formed in the active regions. The word line trenches 200 are arranged in parallel at equal intervals, and there are two word line trenches 200 in a single active region.

Figure 3:
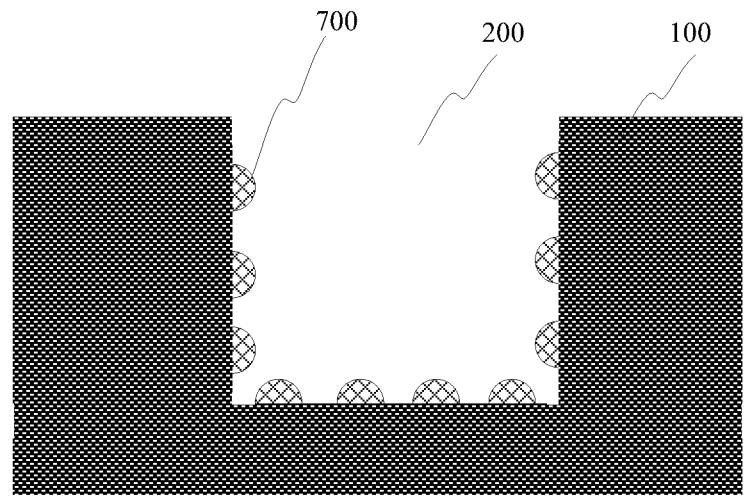
Figure 4:
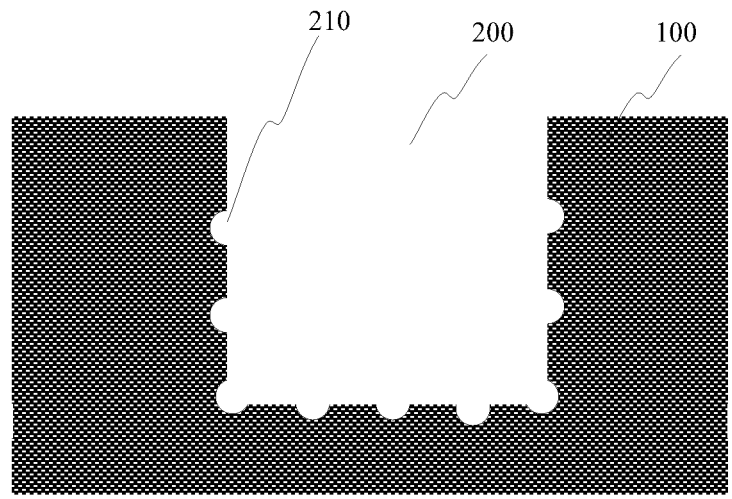

Referring to FIGS. 3 and 4, after the word line trench 200 is formed, by executing S130, concave structures 210 are formed on the sidewall and bottom surface of the word line trench 200 to increase the length of the gate channel. In one embodiment, the forming concave structures 210 on the surface of the word line trench 200 comprises:

forming a plurality of hemispherical silicon crystal particles 700 on the surface of the word line trench 200;

etching the surface of the word line trench 200 by using the plurality of hemispherical silicon crystal particles 700 as masks to form the concave structures 210; and removing the plurality of hemispherical silicon crystal particles 700.

In this embodiment, hemispherical silicon crystal particles 700 are firstly formed on the surface of the word line trench 200 by an HSG process. This process comprises: placing the substrate formed with the word line trench 200 in a reaction chamber for treating, and forming a plurality of hemispherical silicon crystal particles 700 on the sidewall and bottom surface of the treated trench. The size of the hemispherical silicon crystal particles 700 can be controlled by adjusting the reaction time and the reaction condition. Then, the surface of the word line trench 200 is etched by a dry etching process by using the plurality of hemispherical silicon crystal particles 700 as masks, to form a plurality of concave structures 210 on the sidewall and bottom surface of the word line trench 200. Finally, the plurality of hemispherical silicon crystal particles 700 are removed.

Generally, the hemispherical silicon crystal particles 700 are manufactured by a deposition process, e.g., CVD, PVD, LPCVD or the like. In one embodiment, the hemispherical silicon crystal particles are formed by an LPCVD process, in the LPCVD process, the reaction gas comprises SiH4, the reaction temperature ranges from 500° C. to 600° C., and the reaction pressure ranges from 0.1 torr to 0.5 torr.

In this embodiment, the substrate formed with the word line trench 200 is placed in the reaction chamber, and reaction parameters are then adjusted, wherein the reaction temperature ranges from 500° C. to 600° C., and the reaction pressure ranges from 0.1 torr to 0.5 torr. During the reaction process, SiH4 gas is fed into a fluidized bed reactor with particulate silicon powder for continuous thermal decomposition to generate particulate polycrystalline silicon, which adheres to the surface of the substrate 100 and the surface of the word line trench 200. In addition, it is also possible that SiHCl3 is generated in a high-temperature and high-pressure fluidized bed reactor by using SiCl4 (or SiF4), H2 or HCl as a reaction as and metallurgical silicon as raw material; then, SiHCl3 is disproportionated and hydrogenated to generate SiH2Cl2 so as to generate SiH4 gas; and the prepared SiH4 gas is fed into a fluidized bed reactor with particulate silicon powder for continuous thermal decomposition to generate particulate polycrystalline silicon, which adheres to the surface of the substrate 100 and the surface of the word line trench 200.

In addition, in order to reduce the process flow and the production cost, the hard mask layer and the hemispherical silicon crystal particles 700 on the surface of the hard mask layer can be reserved first, so that the substrate 100 is protected by the hard mask layer and the hemispherical silicon crystal particles 700 on the surface of the hard mask layer, and the active region is protected from damage.

Moreover, after the concave structures are formed on the surface of the word line trench 200, the hemispherical silicon crystal particles 700 are removed by using an etching gas including hydrofluoric acid and oxygen, or the substrate formed with the concave structures 210 are exposed to a chorine-based etching gas (which may comprise chlorine, boron trichloride, chlorine trifluoride and hydrogen chloride) and the hemispherical silicon crystal particles 700 removed by using the chorine-based etching gas. Then, the line oxide layer, the hard mask layer and the like on the surface of the substrate 100 are removed by an etching process, a chemical mechanical planarization process or the like, and further cleaned to expose the clean surface of the active region, the sidewall and bottom surface of the word line trench 200 and the inner surfaces of the concave structures 210.

Figure 5:
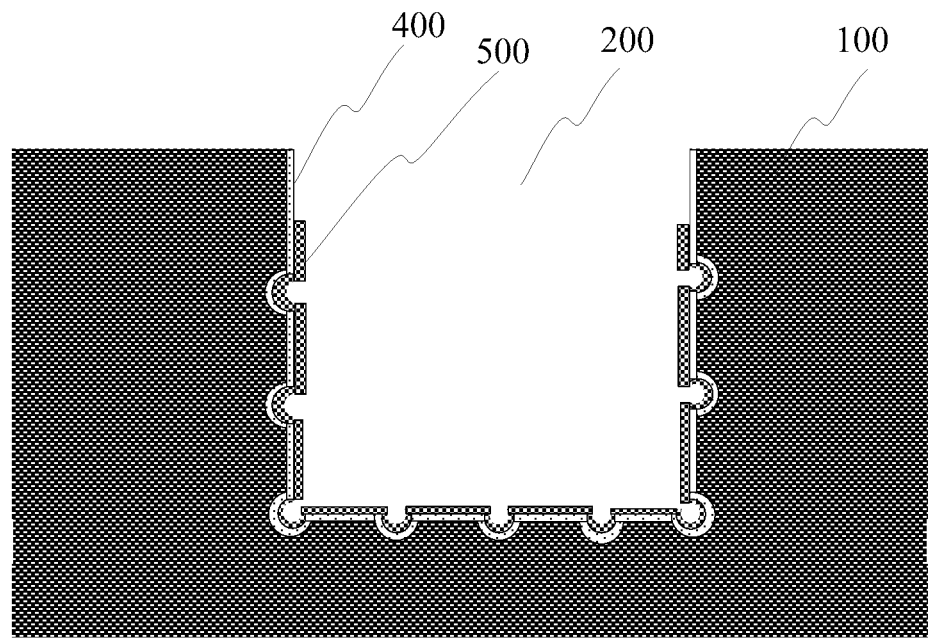

Referring to FIG. 5, after forming the concave structures 210 on the surface of the word line trench 200 and before forming the conductive layer 300, the method further following steps:

forming a gate insulating layer 400, the gate insulating layer 400 covering the surface of the word line trench 200 and the surfaces of the concave structures 210; and forming a metal block layer 500 on the surface of the gate insulating layer 400, the metal block layer 500 being located between the gate insulating layer 400 and the conductive layer 300.

In this embodiment, a gate insulating layer 400 is formed on the sidewall and bottom of the word line trench 200. The gate insulating layer 400 completely covers the sidewall and bottom surface of the word line trench 200 and the surfaces of the concave structures 210; and, the gate insulating layer 400 extends to the top of the word line trench 200, and the top of the gate insulating layer is flush with the top of the substrate. More specifically, for the gate insulating layer 400, a silicon oxide material layer can be formed on the upper surface of the substrate 100, the sidewall and bottom of the word line trench 200 and the surfaces of the concave structures 210 by a deposition process or a thermal oxidation process, the silicon oxide material on the upper surface of the substrate 100 is then removed by an etching process or a chemical mechanical grinding process, and the silicon oxide material layer on the sidewall and bottom of the trench and the surfaces of the concave structures 210 are reserved to form the gate insulating layer 400. In addition, the silicon oxide material may also be replaced with a high-K (the dielectric constant K is greater than 7) dielectric material. Common high-K dielectric materials comprise $Ta_2O_5$, $TiO_2$, $Al_2O_3$, $Pr_2O_3$, $La_2O_3$, $LaAlO_3$, $HfO_2$, $ZrO_2$, or metal oxides of other components.

After the gate insulating layer 400 is formed, a block material layer is formed by a deposition process. The block material layer covers the upper surface of the substrate 100 and the surface of the gate insulating layer 400. Then, the block material layer on the upper surface of the substrate 100 is removed by an etching or chemical mechanical grinding process and the reserved block material layer is used as the metal bock layer 500. In this embodiment, the metal block layer 500 can prevent the conductive material in the conductive layer 300 from diffusing into the gate insulating layer and thus affecting the performance of the gate insulating layer. In addition, the metal block layer 500 also plays a role of enhancing the adhesion between the conductive layer 300 and the gate insulating layer. In addition, in order to ensure that the metal block layer 500 can provide sufficient protection for the conductive layer 300, the formed metal block layer 500 may be of a multilayer stacked composite structure.

In one embodiment, the metal block layer 500 is made from a titanium nitride (TiN) material. Compared with the gate insulating layer 400 alone, the combination of the titanium nitride material layer and the gate insulating layer 400 is advantageous to increase the dielectric constant, decrease the gate length, increase the driving current and reduce the threshold voltage.

Figure 6:
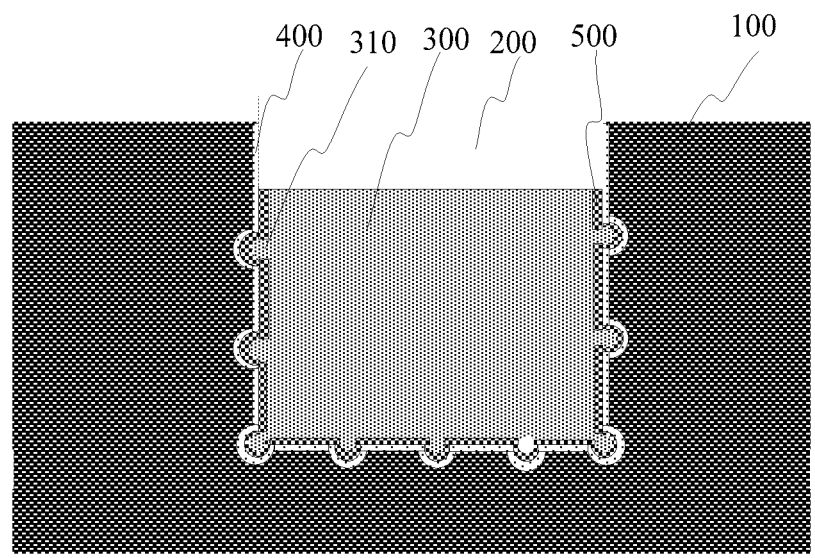

Referring to FIG. 6, after the metal block layer 500 is formed, S140 is executed to form a conductive layer 300 in the word line trench 200, convex structures 310 matched with the concave structures 210 being provided on the surface of the conductive layer 300. In one embodiment, the forming a conductive layer 300 in the word line trench 200 comprises:

forming a metal material layer, the metal material layer covering the upper surface of the substrate 100 and filling the word line trench 200 and the concave structures 210; and removing the metal material layer covering the upper surface of the substrate 100 and a part of the metal material layer located in the word line trench 200, and using the reserved metal material layer as the conductive layer 300.

In this embodiment, a metal material layer is formed by a deposition process, for example, CVD or PVD. The metal material layer fills the word line trench 200 and the concave structures 210, and covers the surface of the metal block layer 500 and the upper surface of the substrate 100. Then, the metal material covering the upper surface of the metal block layer 500 and the upper surface of the substrate 100 and the metal material layer having a partial height located in the word line trench 200 are removed, so that the upper surface of the metal material layer is lower than the upper surface of the substrate 100, and the buried gate is thus formed. Specifically, the metal material comprises one or more of metal materials with good electrical conductivity, such as tungsten, cobalt, manganese, niobium, nickel and molybdenum. In addition, in some embodiments, in order to reduce process and cost, the block material layer and the metal material layer may be etched by a same etching process to form the metal block layer 500 and the conductive layer 300.

In other embodiments, the conductive layer 300 comprises a metal material layer and a semiconductor conductive material layer (not shown) which are stacked. In this embodiment, the material of the semiconductor conductive material layer comprises any one or any combination of polycrystalline silicon, silicon germanide, gallium arsenide, gallium phosphide, cadmium sulfide and zinc sulfide. The semiconductor conductive material layer and the metal material layer form a dual-work function gate. In this embodiment, by providing the stacked conductive layer 300, the problem of gate-induced drain leakage current can be effectively solved.

In addition, in the process of manufacturing the dual-work function gate, the metal in the metal layer will diffuse into the polycrystalline silicon layer after the thermal process, thereby affecting the performance of the polycrystalline silicon layer. On this basis, in one embodiment, the buried gate further comprises a step of forming an equipotential dielectric layer between the metal material and the polycrystalline silicon material layer. The equipotential dielectric layer is used as the metal block layer 500 to prevent the conductive material in the metal material layer from diffusing into the semiconductor conductive material layer, and the metal material layer is communicated with the semiconductor conductive material layer to form equipotential, thereby improving the performance of the device. In this embodiment, the equipotential dielectric layer may be formed from any one or any combination of silicon oxide, silicon nitride, silicon oxynitride, silicon oxycarbide and silicon carbonitride.

Figure 7:
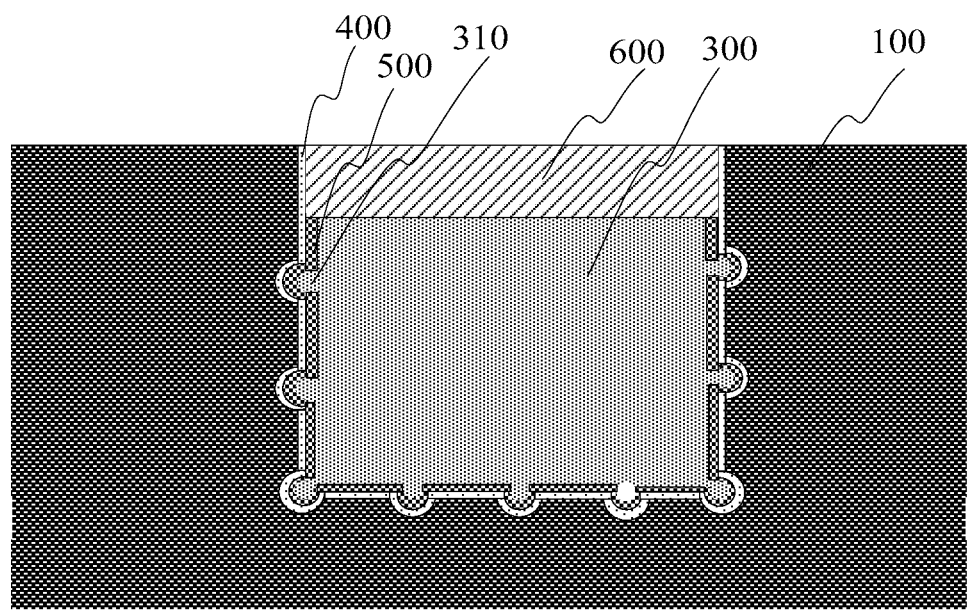

Referring to FIG. 7, in one embodiment, the method for manufacturing a buried gate further comprises following steps:

forming an insulating filling layer 600, the insulating filling layer 600 covering the surface of the substrate 100 and filling the word line trench 200.

In this embodiment, the top of the formed conductive layer 300 is lower than the top of the word line trench 200 to increase the distance between the conductive layer 300 and the subsequently formed storage node plug and bit line connection plug and reduce the parasitic capacitance. By filling the word line trench 200 with silicon nitride or other low-K dielectric materials having high bandwidth and good insulation performance, good protection and insulation effects can be achieved. In addition, the insulating filling layer is flush with the upper surface of the substrate 100 to form a flat surface, so that it is advantageous to form other structures thereon.

Based on the same inventive concept, an embodiment of the present application further provides a buried gate. Continuously referring to FIG. 7, the buried gate comprises a substrate 100, a word line trench 200 and a conductive layer 300.

The word line trench 200 is located in the substrate 100, and recess structures are provided on the surface of the word line trench 200.

The conductive layer 300 is located in the word line trench 200, and bump structures matched with the recess structures are provided on the surface of the conductive layer 300.

In this embodiment, by forming recess structure on the surface of the word line trench 200 and providing convex structures 310 matched with the concave structures 210 on the surface of the conductive layer 300, the relative area between the conductive layer 300 and the word line trench 200 is increased by the concave structures 210 and the convex structures 310. Thus, under the premise of remaining the width of the gate channel unchanged, the length of the gate channel is increased, thereby improving the short channel effect caused by the reduction in device size.

In one embodiment, the conductive layer 300 comprises a metal layer. In this embodiment, the metal layer is formed from one or more of tungsten, cobalt, manganese, niobium, nickel, molybdenum and other metal materials with good electrical conductivity.

In one embodiment, the conductive layer 300 comprises a metal layer and a semiconductor conductive layer 300 which are stacked, wherein the semiconductor conductive layer 300 is located above the metal layer. In this embodiment, the material of the semiconductor conductive material layer comprises any one or any combination of polycrystalline silicon, silicon germanide, gallium arsenide, gallium phosphide, cadmium sulfide and zinc sulfide. The semiconductor conductive material layer and the metal material layer form a dual-work function gate. In this embodiment, by providing the stacked conductive layer 300, the problem of gate-induced drain leakage current can be effectively solved.

In addition, in the process of manufacturing the dual-work function gate, the metal in the metal layer will diffuse into the polycrystalline silicon layer after the thermal process, thereby affecting the performance of the polycrystalline silicon layer. On this basis, in one embodiment, the buried gate further comprises an equipotential dielectric layer between the metal material and the polycrystalline silicon material layer. The equipotential dielectric layer is used as a metal block layer 500 to prevent the conductive material in the first conductive layer 300 from diffusing into the second conductive layer 300, and the first conductive layer 300 is communicated with the second conductive layer 300 to form equipotential, thereby improving the performance of the device. In this embodiment, the equipotential dielectric layer may be formed from any one or any combination of silicon oxide, silicon nitride, silicon oxynitride, silicon oxycarbide and silicon carbonitride.

In one embodiment, the buried gate further comprises a metal block layer 500 located between the gate insulating layer 400 and the metal layer. In this embodiment, the metal block layer 500 can prevent the conductive material in the conductive layer 300 from diffusing into the gate insulating layer and thus affecting the performance of the gate insulating layer. In addition, the metal block layer 500 also plays a role of enhancing the adhesion between the conductive layer 300 and the gate insulating layer. In addition, in order to ensure that the metal block layer 500 can provide sufficient protection for the conductive layer 300, the formed metal block layer 500 may be of a multilayer stacked composite structure. In addition, in this embodiment, the metal block layer 500 may be made from a titanium nitride (TiN) material. Compared with the gate insulating layer 400 alone, the combination of the titanium nitride material layer and the gate insulating layer 400 is advantageous to increase the dielectric constant, decrease the gate length, increase the driving current and reduce the threshold voltage.

In one embodiment, the buried gate further comprises a gate insulating layer 400 located between the conductive layer 300 and the substrate 100. In this embodiment, the gate insulating layer 400 completely covers the sidewall and bottom surface of the word line trench 200 and the surfaces of the concave structures 210; and, the gate insulating layer 400 extends to the top of the word line trench 200, and the top of the gate insulating layer is flush with the top of the substrate. In addition, the gate insulating layer 400 may be made from silicon oxide. In other embodiments, the silicon oxide material may also be replaced with a high-K (the dielectric constant K is greater than 7) dielectric material. Common high-K dielectric materials comprise $Ta_2O_5$, $TiO_2$, $Al_2O_3$, $Pr_2O_3$, $La_2O_3$, $LaAlO_3$, $HfO_2$, $ZrO_2$, or metal oxides of other components.

In one embodiment, the buried gate further comprises an insulating filling layer 600. In this embodiment, the top of the conductive layer 300 is lower than the top of the word line trench 200, so that the distance between the conductive layer 300 and the subsequently formed storage node plug and bit line connection plug can be increased and the parasitic capacitance can be reduced. By filling the word line trench 200 with silicon nitride or other low-K dielectric materials having high bandwidth and good insulation performance, good protection and insulation effects can be achieved. In addition, the insulating filling layer is flush with the upper surface of the substrate 100 to form a flat surface, so that it is advantageous to form other structures thereon.

To sum up, the present application provides a buried gate and a manufacturing method thereof. The method for manufacturing a buried gate comprises following steps: providing a substrate 100; forming a word line trench 200 in the substrate 100; treating the surface of the word line trench 200 to form concave structures 210 on the surface of the word line trench 200; and, forming a conductive layer 300 in the word line trench 200, convex structures 310 matched with the concave structures 210 being provided on the surface of the conductive layer 300. In the present application, by forming concave structures 210 on the surface of the word line trench 200 and then forming, in the word line trench 200, a conductive layer 300 having convex structures 310 matched with the concave structures 210 on its surface, the length of the word line trench 200 is increased by changing the shape of the word line structure 200 without changing the width of the word line trench 200, so that the short channel effect caused by the reduction in device size is solved, and the quality of the device is improved.

Various technical features of the above embodiments can be arbitrarily combined. For simplicity, all possible combinations of various technical features in the above embodiments are not described. However, all combinations of these technical features shall fall into the scope recorded by this specification if not conflicted.

The above embodiments merely show several implementations of the present application. The description of these embodiments is specific and detailed relatively, but cannot be interpreted as limiting the patent scope of the invention. It should be noted that, for a person of ordinary skill in the art, several variations and improvements can be made without departing from the concept of the present application, and all the variations and improvements shall fall into the protection scope of the present application. Therefore, the protection scope of the present application should be subject to the appended claims.

What is claimed is:

1. A method for manufacturing a buried gate, comprising:
   providing a substrate;
   forming a word line trench in the substrate;
   treating a surface of the word line trench to form concave structures on the surface of the word line trench; and
   forming a conductive layer in the word line trench, convex structures matched with the concave structures being provided on a surface of the conductive layer;
   wherein the forming concave structures on the surface of the word line trench comprises:
   forming a plurality of hemispherical silicon crystal particles on the surface of the word line trench;
   etching the surface of the word line trench by using the plurality of hemispherical silicon crystal particles as masks to form the concave structures; and
   removing the plurality of hemispherical silicon crystal particles.

2. The method according to claim 1, wherein the hemispherical silicon crystal particles are formed by an LPCVD process, in the LPCVD process, a reaction gas comprises SiH4, a reaction temperature ranges from 500° C. to 600° C., and a reaction pressure ranges from 0.1 torr to 0.5 torr.

3. The method according to claim 1, wherein the forming a conductive layer in the word line trench comprises:
   forming a metal material layer, the metal material layer covering an upper surface of the substrate and filling the word line trench and the concave structures; and
   removing the metal material layer covering the upper surface of the substrate and a part of the metal material layer located in the word line trench, and using the reserved metal material layer as the conductive layer.

4. The method according to claim 3, before the forming a metal material layer, further comprising:
   forming a gate insulating layer, the gate insulating layer covering the surface of the word line trench and surfaces of the concave structures; and
   forming a metal block layer on a surface of the gate insulating layer, the metal block layer being located between the gate insulating layer and the conductive layer.

5. The method according to claim 1, further comprising:
   forming an insulating filling layer, the insulating filling layer covering a surface of the substrate and filling the word line trench.

* * * * *